March 21, 1967 W. M. STEWART 3,310,754
OSCILLATOR TRIGGER CIRCUIT INCLUDING UNIDIRECTIONAL CONDUCTING
DEVICE IN THE FEEDBACK PATH THEREOF
Filed Aug. 19, 1965

INVENTOR.
WILLIAM M. STEWART
BY
McLaughlin, Cahill & Drummond
ATTORNEYS

United States Patent Office 3,310,754

Patented Mar. 21, 1967

3,310,754

OSCILLATOR TRIGGER CIRCUIT INCLUDING UNIDIRECTIONAL CONDUCTING DEVICE IN THE FEEDBACK PATH THEREOF

William M. Stewart, 2926 Calle Glorietta, Tucson, Ariz. 85716

Filed Aug. 19, 1965, Ser. No. 480,884
2 Claims. (Cl. 331—112)

The present invention pertains to circuits for triggering oscillators, and more specifically, to a novel trigger circuit wherein a relaxation oscillator may be caused to oscillate in response to a predetermined trigger signal.

The use of solid state components in electronic circuits is usually accompanied by certain disadvantages that, for the most part, are outweighted by the advantages gained. However, some of these disadvantages are nevertheless troublesome and attempts have been made to overcome the difficulties arising from these disadvantages. In electronic circuit applications requiring the use of a triggered oscillator, it is sometimes difficult to obtain a reliable triggering arrangement that will give prompt response to an input signal and will reliably respond to the absence of an input signal for turning the oscillator off. The above-mentioned difficulties are particularly applicable to oscillators utilizing a transistor which must be triggered through the application of an appropriate signal to the base electrode thereof. When the transistor is included in the oscillator circuit, the application of an appropriate triggering pulse to the base electrode thereof may become a source of difficulty; the response to a trigger signal and the reliability may greatly be enhanced if the transistor could be forward-biased. However, forward biasing a transistor contained within an oscillator circuit usually results in unwanted oscillations and is therefore generally considered undesirable.

It is therefore an object of the present invention to provide a means for reliably triggering an oscillator circuit.

It is also an object of the present invention to provide a means for applying a triggering signal to the base electrode of a transistor contained in an oscillator circuit.

It is a further object of the present invention to provide an oscillator trigger circuit including a continuously forward biased transistor.

These and other objects of the present invention will become apparent to those skilled in the art as the description thereof proceeds.

Briefly, in accordance with one embodiment of the present invention, a diode is placed in the base circuit of a transistor and is poled to enable biasing current to flow therethrough. The voltage-current characteristic of the diode is utilized to control the forward-biased current to the extent that attempts to increase base current are met with a substantially increased effect resistance to the current flow resulting in a self-regulating action to thereby restrain further base current flow. Upon the application of a suitable triggering signal, the current flowing through the diode places the operation of the diode at a different location on the voltage-current characteristic to permit sufficient feedback in the transistor through an oscillating circuit to permit oscillations to begin. The present invention may more readily be described by reference to the accompanying drawings in which:

Figure 1:
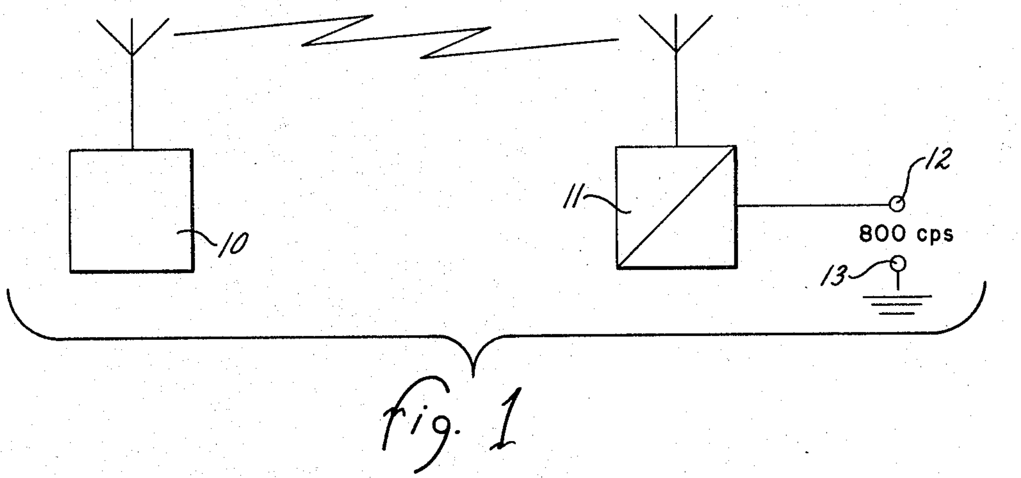
FIGURE 1 is a simplified schematic block diagram of an appropriate means for generating an input trigger signal to the circuit of the present invention.

Referring now to FIGURE 1, the applications of trigger oscillators are many; however, the present circuit was found particularly useful in an application requiring remote triggering. A transmitter 10 is provided and transmits an audio modulated frequency of 27 megacycles which is subsequently received and demodulated by the receiver-demodulator 11. The resulting audio frequency is provided at terminals 12 and 13 and is used as a triggering signal to instigate oscillations as will be described more completely hereinafter.

Figure 2:
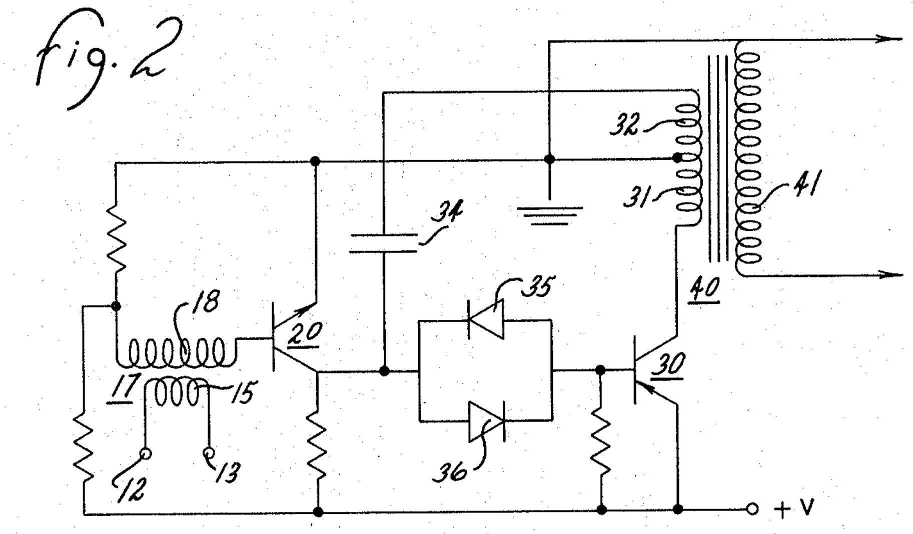
FIGURE 2 is a schematic circuit diagram of a triggered oscillator incorporating the teachings of the present invention.

Referring now to FIGURE 2, the terminals 12 and 13 are shown connected to the primary winding 15 of an input transformer 17. The secondary winding 18 is connected to the base electrode of a transistor 20. The transistor 20 serves as an amplifying and gating element to receive the input signal and generate therefrom appropriate trigger signals for the application to the oscillator trigger. The emitter electrode is connected to ground and the collector electrode is connected to a suitable positive potential source as indicated in FIGURE 2.

An oscillator to be triggered includes a transistor 30 having a feedback path from the collector electrode thereof to the base electrode through a pair of mutually inductive windings 31 and 32, a capacitor 34, and a diode 35. The diode 35 is a PN junction type having a characteristic such as that shown in FIGURE 3. A second diode 36 is connected in parallel and is poled oppositely to the diode 35. A step-up transformer 40 includes a secondary winding 41 and provides a high voltage output to an appropriate utilization device. The bias provided to the transistor 30 is such that the transistor is continuously forward biased and a base current continues to flow through the diode 35 at all times.

Figure 3:
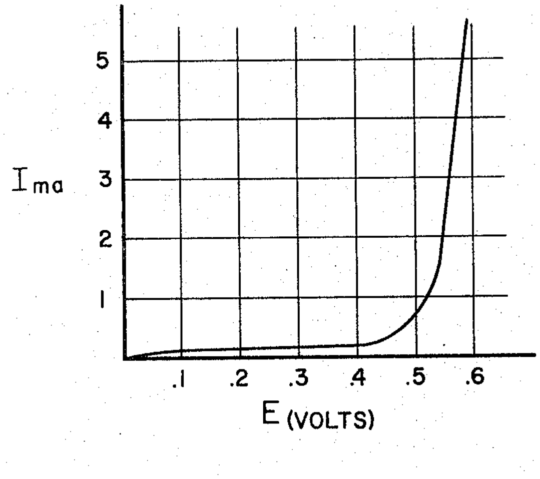
FIGURE 3 is a curve representing the voltage-current characteristic of a typical PN junction diode useful for describing the operation of the present invention.

Before describing the operation of the circuit of FIGURE 2, reference will now be made to FIGURE 3 to form a basis for the description to follow. Referring to FIGURE 3, a current-voltage characteristic is shown for a PN junction diode such as the one shown at 35. It will be noted that in the forward biased direction (the quadrant shown in FIGURE 3 is the forward bias quadrant for the PN junction) any attempt to increase the current through the junction results in a substantial increase in voltage until the voltage reaches a predetermined value (0.5 for the example chosen for illustration). Thus, with a slight current flowing through the diode, any attempted increase in current flowing therethrough will result in a relatively large increase in voltage drop across the diode. Stated in another way, the incremental resistance of the diode in the forward direction is quite large until the forward voltage drop exceeds the knee of the curve of FIGURE 3. Returning now to FIGURE 2, the operation of the circuit shown therein will be described. During the "off" condition for the oscillator shown therein, the transistor 30 will be continuously forward biased and base current will flow through the diode 35 and the collector-emitter circuit of the transistor 20. The current flowing through the diode 35 may be chosen to be a very low current such that the diode 35 is operating at the high incremental impedance portion of its voltage-current characteristic. Any attempt to increase the current through the diode 35 through the action of positive feedback from the coil 32 and capacitor 34 will result in a relatively large increase in the forward voltage drop across the diode 35. The increase in forward voltage drop across the diode 35 will tend to oppose the increase in current caused by the positive feedback. As a result of this large incremental impedance, the transistor 30 will remain in a stable state of forward bias. Since the only output derived from the oscillator is that occurring at the secondary of the transformer 40, the slight current flowing through the winding 31 will not result in an output on the secondary winding 41. When a signal is applied to the terminals 12 and 13, the resistance of the collector-emitter circuit of the transistor 20 is greatly reduced, and the current flowing in the base of the transistor 30 is thus substantially increased to the point where the current flowing through the diode 35 exceeds the knee of its voltage-current characteristic and the incremental impedance is drastically reduced (a slight increase in voltage results in a substantially increase in current). Having reduced the incremental impedance present by the diode 35, the transistor 30 begins to increase the current flowing through the emitter-collector circuit resulting in a positive feedback through the mutually coupled inductive coil 32 and capacitor 34. The current flowing through the transistor 30 thus increases to saturation at which time the rate of change of current is reduced to zero and the collapsing field begins turning the transistor 30 off. The operation will repeat itself so long as the impedance in the base of the transistor 30 is low enough to permit positive feedback to the transistor. Thus, if the transistor 20 is no longer in a low impedance state, the current flowing through the diode 35 will immediately be reduced (at the end of its present oscillation) to a value wherein the incremental resistance or impedance is very high. Continued oscillation is thus prevented as previously described and no output will be presented on the winding 41. While the phenomena is not completely understood, it has been found that the inclusion of diode 36 in parallel with the diode 35 and oppositely poled thereto increases the amplitude of the available output by a substantial margin. It is believed that when the transistor 30 reaches saturation and the field in the transformer 40 begins to collapse, the current generated by the collapsing field is permitted at least partially to flow through the diode 36 and the base collector circuit of transistor 30 to assist in the generation of an oppositely poled pulse in the transformer secondary 41.

It has been known to use oppositely poled diodes in the base circuit of a transistor; however, the utilization of the voltage-current characterstic of a PN junction diode to thereby make use of the incremental impedance presented thereby has heretofore been unknown and the results achieved thereby present a unique method of controlling a solid state oscillator by permitting continuous forward biasing of the trigged element. It will be obvious to those skilled in the art that the PNP transistor and the NPN transistor may be exchanged for transistors of different types; it is also obvious that other solid state triggering devices utilizing a control electrode current for triggering may utilize the same principal of the varying incremental impedance in the forward biased direction of a PN junction diode.

I claim:

1. An oscillator trigger comprising: a unidirectional conducting device having an anode and a cathode and having a given forward incremental impedance and a substantially lower forward incremental impedance when the current flowing therethrough exceeds a predetermined value; a first transistor having a base electrode, a collector electrode and an emitter electrode; means connecting a bias potential to said first transistor; a first transformer having a secondary winding connected in series with said base electrode and a primary winding adapted to receive input signals; a second transistor having a base electrode, a collector electrode, and an emitter electrode; means connecting a bias potential to said second transistor; a second transformer having a pair of mutually inductive primary windings and a secondary winding adapted to provide an output signal; a feedback path connected between the collector and base electrodes of said second transistor, said feedback including, in series, said pair of mutually inductive primary windings, a capacitor, and said unidirectional conducting device; said unidirectional conducting device having the cathode thereof connected to said capacitor and to the collector electrode of said first transistor; said second transistor being in a substantially quiescent state when forward biased by said unidirectional conducting device having substantially said given forward incremental impedance, wherein an input signal applied to the primary winding of said first transformer increases the current flowing through said unidirectional conducting device to a value exceeding said predetermined value causing the said second transistor to produce oscillations.

2. The circuit defined in claim 1 wherein said feedback path includes a second unidirectional conducting device connected in parallel and poled oppositely to the first unidirectional device.

References Cited by the Examiner

UNITED STATES PATENTS

| | | | |
|---|---|---|---|
| 3,035,220 | 5/1962 | Fischer | 331—112 |
| 3,054,967 | 9/1962 | Gindi | 331—111 |
| 3,145,348 | 8/1964 | Massey | 331—111 |
| 3,155,920 | 11/1964 | Wells | 331—111 |
| 3,159,799 | 12/1964 | Cooper | 331—112 |
| 3,193,781 | 7/1965 | Martner | 331—112 |
| 3,202,935 | 8/1965 | Maluda | 331—111 |
| 3,239,775 | 3/1966 | Putterman | 331—111 |

ROY LAKE, *Primary Examiner.*

J. KOMINSKI, *Assistant Examiner.*